(12) United States Patent
Gong et al.

(10) Patent No.: US 10,672,461 B2
(45) Date of Patent: Jun. 2, 2020

(54) WRITE ASSIST NEGATIVE BIT LINE VOLTAGE GENERATOR FOR SRAM ARRAY

(71) Applicant: Nvidia Corporation, Santa Clara, CA (US)

(72) Inventors: Haiyan Gong, Santa Clara, CA (US); Lei Wang, Santa Clara, CA (US); Sing-Rong Li, Santa Clara, CA (US); Hwong-Kwo Lin, Santa Clara, CA (US); Pai-Yi Chang, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 1114 days.

(21) Appl. No.: 14/160,706

(22) Filed: Jan. 22, 2014

(65) Prior Publication Data
US 2015/0206576 A1    Jul. 23, 2015

(51) Int. Cl.
*G11C 11/419*  (2006.01)
*G11C 7/12*    (2006.01)

(52) U.S. Cl.
CPC .............. *G11C 11/419* (2013.01); *G11C 7/12* (2013.01)

(58) Field of Classification Search
CPC .............................................. G11C 11/41–419
USPC ....................... 365/154, 189.2, 156; 257/903
See application file for complete search history.

(56) References Cited

U.S. PATENT DOCUMENTS

| 8,174,867 B2 * | 5/2012 | Wu .......................... G11C 11/00 365/154 |
| 2004/0233701 A1 * | 11/2004 | Turner ................ G11C 11/4125 365/154 |
| 2015/0076575 A1 * | 3/2015 | Wu et al. ...................... 257/296 |

* cited by examiner

*Primary Examiner* — Alfredo Bermudez Lozada

(57) ABSTRACT

A negative bit line write assist system includes an array voltage supply and a static random access memory (SRAM) cell that is coupled to the array voltage supply and controlled by bit lines during a write operation. Additionally, the negative bit line write assist system includes a bit line voltage unit that is coupled to the SRAM cell, wherein a distributed capacitance is controlled by a write assist command to provide generation of a negative bit line voltage during the write operation. A negative bit line write assist method is also provided.

16 Claims, 5 Drawing Sheets

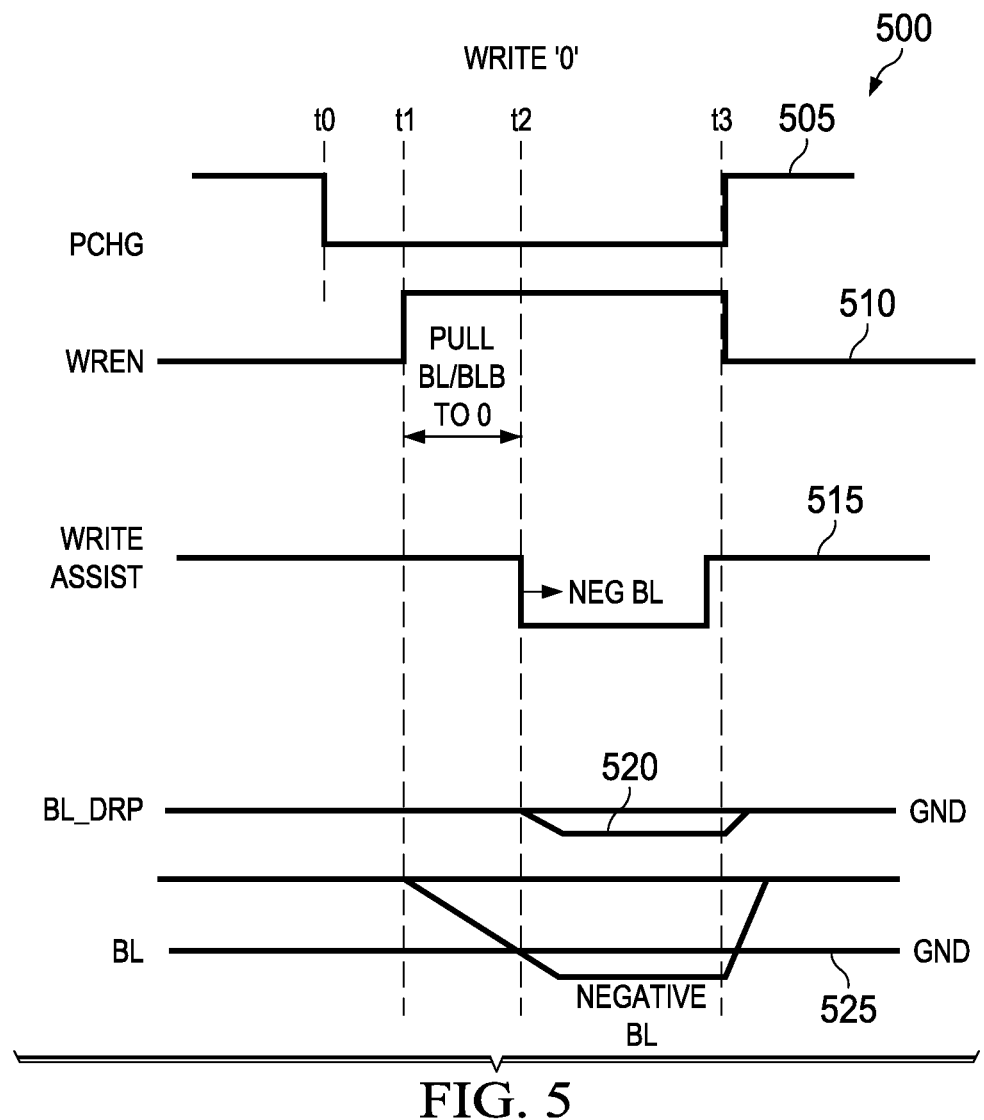

WRITE ASSIST NEGATIVE BIT LINE VOLTAGE GENERATOR FOR SRAM ARRAY

TECHNICAL FIELD

This application is directed, in general, to a semiconductor memory and, more specifically, to a negative bit line write assist system and a negative bit line write assist method.

BACKGROUND

As technology advances, SRAM core voltage reduction has lagged behind logic voltage, and has become a limiting bottleneck for semiconductor chip power consumption improvement. The main limiting factor is that the minimum voltage (Vmin) of an SRAM write voltage cannot be scaled down aggressively due to increased threshold voltage variations and increased SRAM capacity requirements as the device size decreases. To resolve this issue, write assist circuits have become a main focus of interest to allow further reduction of the minimum voltage (Vmin) without write failure. Write failure often occurs when a pass gate transistor cannot overpower a corresponding pull up transistor in an SRAM cell. Improvements in this area would be beneficial to the art.

SUMMARY

Embodiments of the present disclosure provide a negative bit line write assist system and a negative bit line write assist method.

In one embodiment, the negative bit line write assist system includes an array voltage supply and a static random access memory (SRAM) cell that is coupled to the array voltage supply and controlled by bit lines during a write operation. Additionally, the negative bit line write assist system includes a bit line voltage unit that is coupled to the SRAM cell, wherein a distributed capacitance is controlled by a write assist command to provide generation of a negative bit line voltage during the write operation.

In another aspect, the negative bit line write assist method includes providing an array supply voltage and also providing a static random access memory (SRAM) cell coupled to the array supply voltage and controlled by bit lines during a write operation. The negative bit line write assist method also includes generating a negative bit line voltage for the SRAM cell employing a distributed capacitance controlled by a write assist command during the write operation.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which:

FIG. 5 illustrates a timing diagram corresponding to the schematic diagram of FIG. 4.

DETAILED DESCRIPTION

Embodiments of the present disclosure provide a write assist approach for memory applications that efficiently employs less layout area, memory power and propagation delay overhead, while maximizing negative bit line benefits. Design complexity is reduced for compiler memory, which can speed up product readiness. The write assist approach also improves SRAM yields, thus reducing fabrication costs.

Figure 1:
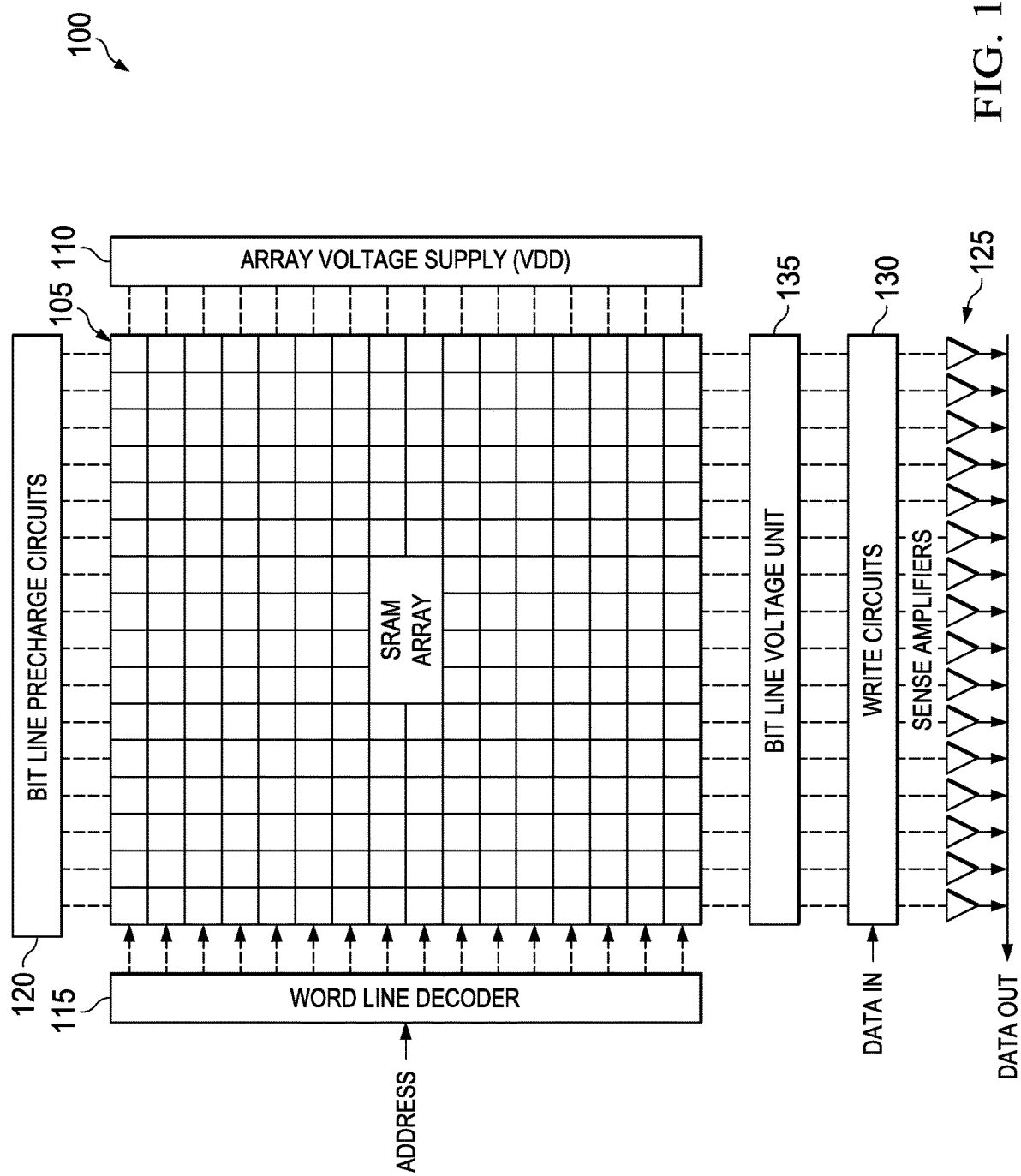
FIG. 1 illustrates a diagram of an SRAM memory that includes a negative bit line write-assist system constructed according to the principles of the present disclosure.

FIG. 1 illustrates a diagram of an SRAM memory, generally designated 100, that includes a negative bit line write-assist system constructed according to the principles of the present disclosure. The SRAM memory 100 includes an SRAM array 105, an array voltage supply 110, a word line decoder 115, bit line precharge circuits 120, sense amplifiers 125, write circuits 130 and a bit line voltage unit 135.

The SRAM array 105 includes a group of SRAM cells wherein each SRAM cell stores one bit of data. The group of SRAM cells is arranged horizontally into rows corresponding to a number of bits per word of the SRAM memory 100 and vertically corresponding to a total number of words contained in the SRAM memory 100. The array voltage supply 110 provides a supply voltage VDD not only to the SRAM array 105, but to the SRAM memory 100, in general.

The word line decoder 115 determines which word of the total number of words is to be addressed and enables a word line of that row of bits for further action (e.g., reading from or writing into that particular word). In this particular embodiment, each SRAM cell employs two bit lines (i.e., a bit line pair per array column). All of the bit line pairs are precharged to a TRUE condition by the precharge bit line circuits 120 before the word line is enabled to facilitate reading from or writing to the word row after the word line is enabled.

The sense amplifiers 125 support reading a data storage condition of each SRAM cell in the selected word line to provide data output from the SRAM memory 100. Correspondingly, the write circuits 130 support writing of input data into each SRAM cell of the selected word line during a write operation to provide data input to the SRAM memory 100. In this embodiment, the bit line voltage unit 135 is coupled to each SRAM cell through its corresponding bit lines, wherein a distributed capacitance that includes an upper metal coupling capacitance provides generation of a negative bit line voltage during the write operation.

Figure 2:
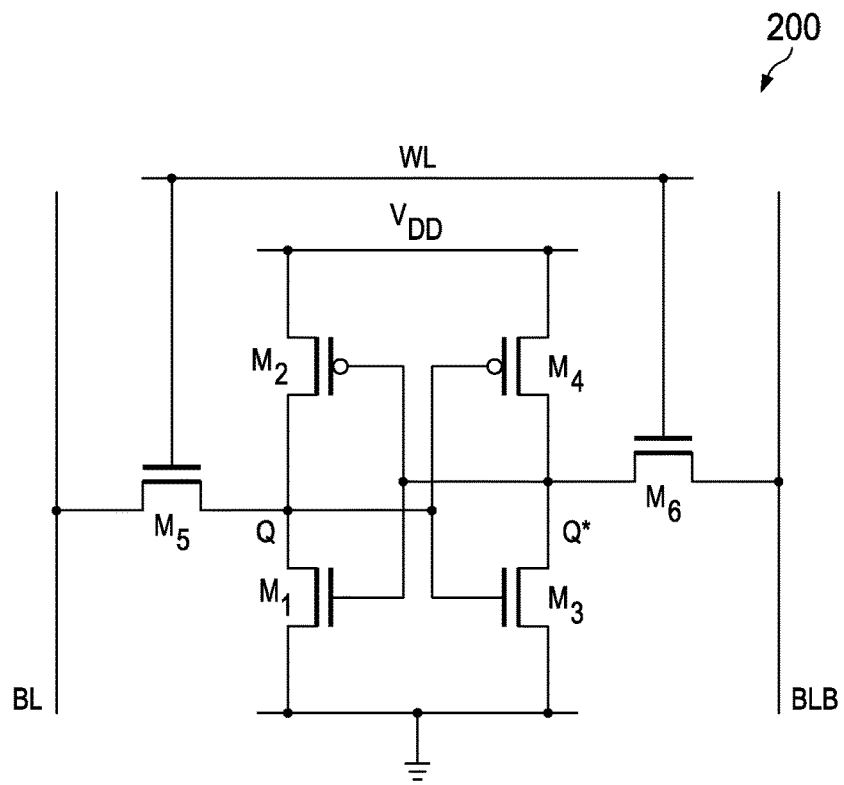
FIG. 2 illustrates a diagram of an SRAM cell as may be employed in the SRAM array of FIG. 1.

FIG. 2 illustrates a diagram of an SRAM cell, generally designated 200, as may be employed in the SRAM array 105 of FIG. 1. The SRAM cell 200 includes a pair of cross-coupled CMOS inverters M1:M2 and M3:M4 that provide a memory cell having storage nodes Q and Q*, which are complementary, as shown. The SRAM cell 200 also includes corresponding first and second pass gate transistors M5 and M6 that are respectively connected between a bit line BL and the storage node Q and a complementary bit line BLB and the complementary storage node Q*. The first and second pass gate transistors M5 and M6 are controlled by a word line WL, and the cross-coupled CMOS inverters M1:M2 and M3:M4 are powered by an array voltage supply VDD.

In the illustrated embodiment, the appropriate bit line (BL or BLB) is provided with a negative bit line voltage during a write operation. This event facilitates writing into the SRAM cell 200 by increasing (i.e., strengthening) a magnitude of the bit line voltage, thereby enhancing the write operation for the SRAM cell 200.

Here, the negative bit line voltage is provided through additional charge coupling to an appropriate bit line during a write operation. This charge coupling employs distributed capacitances that are provided by judicious design and layout of an SRAM array such as the SRAM array 105 of FIG. 1. These distributed capacitances are typically fringing capacitances in an upper metal layer of the SRAM array or memory, and this write assist approach is scalable with (i.e., adaptable to) SRAM array or memory size.

Figure 3:
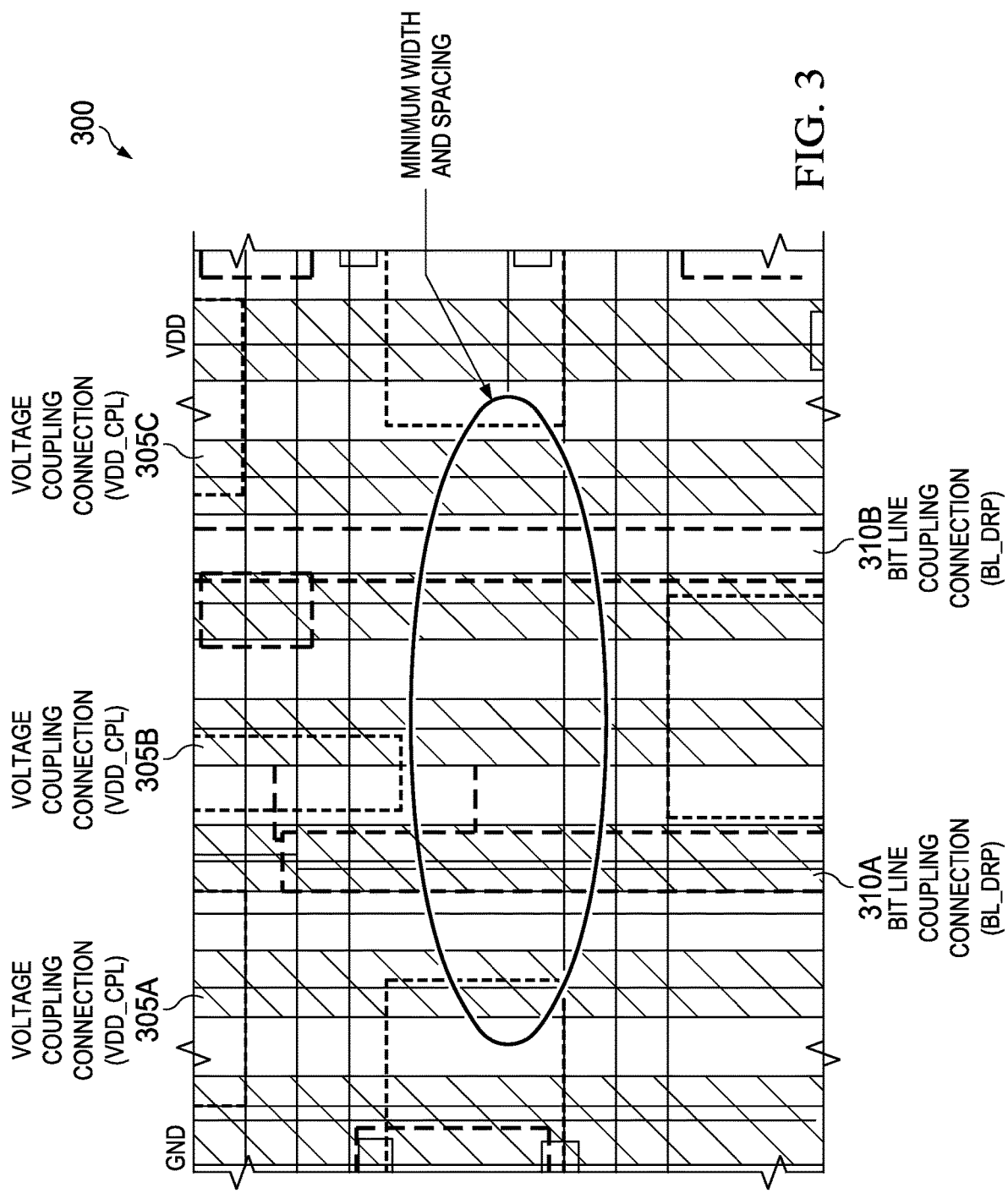
FIG. 3 illustrates a view of an embodiment of an upper metal layer pattern of an SRAM array or memory as may be employed in the SRAM memory of FIG. 1.

FIG. 3 illustrates a view of an embodiment of an upper metal layer pattern of an SRAM array or memory, generally designated 300, as may be employed in the SRAM memory 100 of FIG. 1. The upper metal layer pattern 300 includes a voltage coupling connection 305A, 305B, 305C, a bit line coupling connection 310A, 310B, an array supply voltage (VDD) connection and a ground (GND) connection.

As shown, the voltage coupling (VDD_CPL) connection 305A, 305B, 305C and the bit line coupling (BL_DRP) connection 310A, 310B are interleaved structures that are located between the array supply voltage (VDD) connection and the ground (GND) connection and employ minimum widths and spacings, which enhances the distributed capacitance between them.

These minimum widths and spacings provide an enhanced efficiency. To conserve power, VDD_CPL also needs to maintain a minimized width. Extraction results indicate that the coupling capacitance between VDD_CPL and BL_DRP is about 75% of a total BL_DRP capacitance, which makes this approach much efficient. The voltage coupling connection 305A, 305B, 305C and the bit line coupling connection 310A, 310B are substantially a same length as array bit lines thereby maintaining critical capacitance ratios when array size scaling occurs.

These connection structures additionally employ a plurality of metal wires thereby increasing their fringing capacitance, which may be a dominant capacitance when compared to area capacitance, due to technology scaling. In this embodiment, a distributed capacitance is employed in a metal layer above an SRAM array or memory, and no additional layout area is needed as would typically be the case when using only local capacitors. In the general case, a distributed capacitance between any interleaved parallel metal wires may be employed, when appropriately connected.

Figure 4:
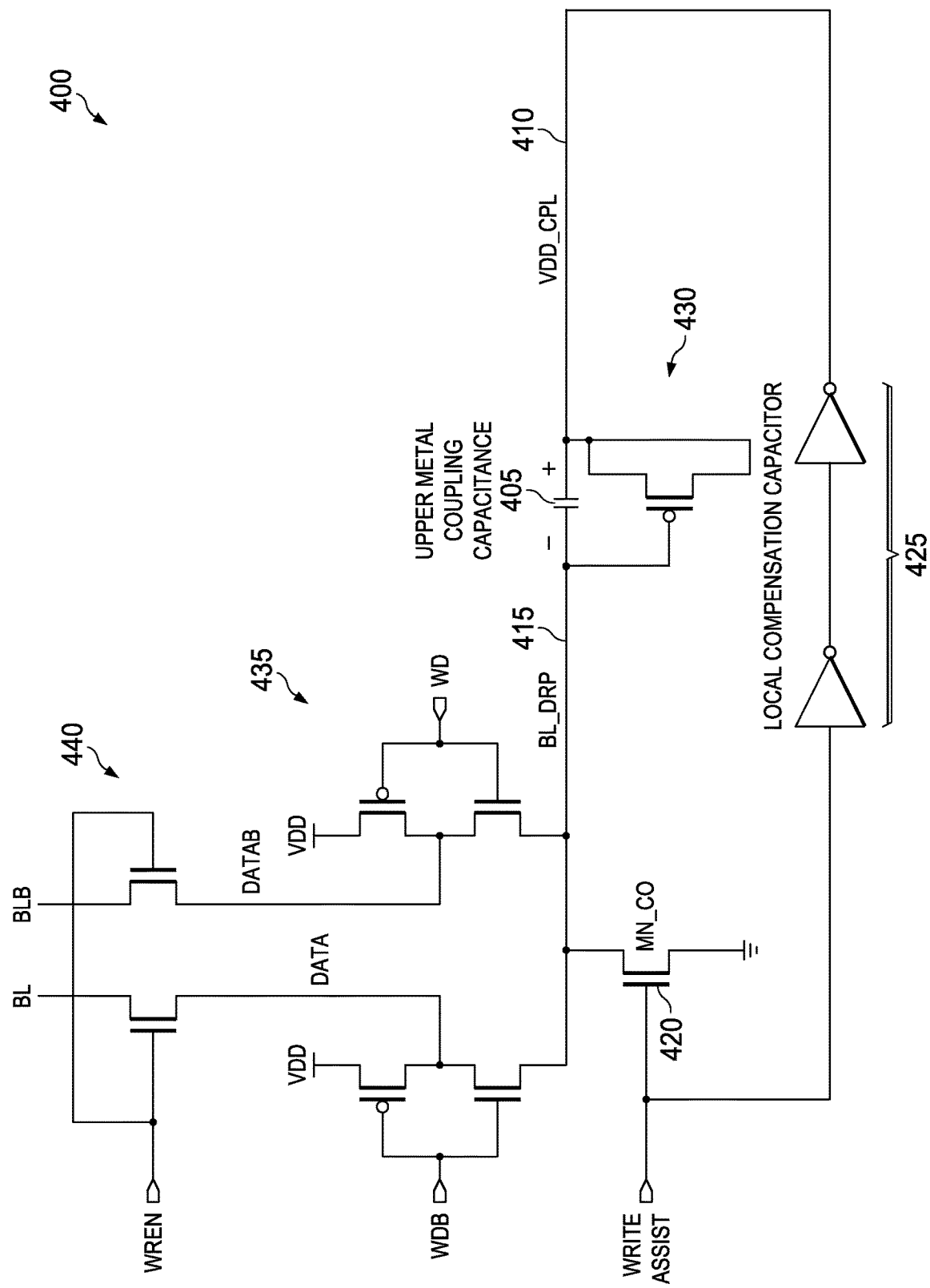
FIG. 4 illustrates a schematic diagram showing an embodiment of a bit line voltage unit constructed according to the principles of the present disclosure.

FIG. 4 illustrates a schematic diagram, generally designated 400, showing an embodiment of a bit line voltage unit constructed according to the principles of the present disclosure. The bit line voltage unit 400 includes an upper metal coupling capacitance 405 that is connected to a voltage coupling connection (VDD_CPL) 410 and a bit line coupling connection (BL_DRP) 415. Here, the upper metal coupling capacitance 405 is representative of the distributed capacitance created between the voltage coupling (VDD_CPL) connection 305A, 305B, 305C and the bit line coupling (BL_DRP) connection 310A, 310B of FIG. 3. Also included is a write assist grounding switch 420 that is employed to ground the bit line coupling connection 415, at an appropriate time.

Additionally included is a write assist buffer circuit 425 that provides a charging voltage for the upper metal coupling capacitance 405. Further included are write driver (WDB, WD) circuits 435 and write enable (WREN) circuits 440 that support control of bit lines BL and BLB.

A local compensation capacitor 430 is included and connected in parallel with the upper metal coupling capacitance 405, wherein the local compensation capacitor 430 is employed to compensate a local bit line write path parasitic and device capacitance thereby making the negative bit line voltage substantially constant across various array depths. Here, the local compensation capacitor 430 is a gate coupling capacitor wherein its gate size is tunable across different input-output structure sizes and therefore constant for a same input-output structure. Thus, embodiments of the present disclosure are particularly suited for compiler random access memory applications.

FIG. 5 illustrates a timing diagram, generally designated 500, corresponding to the schematic diagram 400 of FIG. 4. The timing diagram 500 includes waveforms that demonstrate a write assist providing a negative bit line voltage based on embodiments and principles of the present disclosure.

The timing diagram 500 illustrates waveforms and timing of three salient bit line control signals for a write operation that include a bit line precharge waveform (PCHG) 505, a write enable waveform (WREN) 510 and a write assist control waveform (WRITE ASSIST) 515. The timing diagram 500 also illustrates waveforms and timing of two resulting signals that include a negative bit line voltage that exists on a bit line coupling connection waveform (BL_DRP) 520 and a bit line BL voltage waveform 525 coupled to a bit line (BL) showing the negative bit line voltage that is coupled to the bit line (BL).

The PGHG waveform 505 indicates that the write operation occurs when the PCHG control signal is not activated between timing events t0-t3. At timing event t1, the control signal WREN 510 is activated while the control signal WRITE ASSIST 515 is already activated. This condition causes the bit line BL to begin discharging from its precharged voltage level to a ground (GND) level (in this embodiment) as shown in the bit line (BL) voltage waveform 525, since the write assist grounding switch 420 is activated thereby connecting the bit line coupling connection (BL_DRP) 415 to ground potential.

Additionally, the voltage coupling connection (VDD_CPL) 410 is being maintained at a voltage equal to an array supply voltage VDD (in this embodiment) by the write assist buffer circuit 425 thereby charging the upper metal coupling capacitance 405 and the local compensation capacitor 430 to the array supply voltage VDD, with the polarity shown.

At timing event t2, the bit line BL has reached ground potential, and the WRITE ASSIST control signal 515 is deactivated. This action deactivates the write assist grounding switch 420 and drives the voltage coupling connection (VDD_CPL) 410 to ground potential, thereby causing the bit line coupling connection (BL_DRP) 415 to provide a negative voltage as shown in the bit line coupling connection waveform (BL_DRP) 520.

This negative voltage condition is conveyed to the bit line BL (in this example) by the write driver (WDB, WD) circuits 435 and write enable (WREN) circuits 440 as seen in the bit line voltage waveform 525. At timing event t3, the write operation is complete and all of the waveforms of FIG. 5 return to their starting conditions, as shown.

Figure 6:
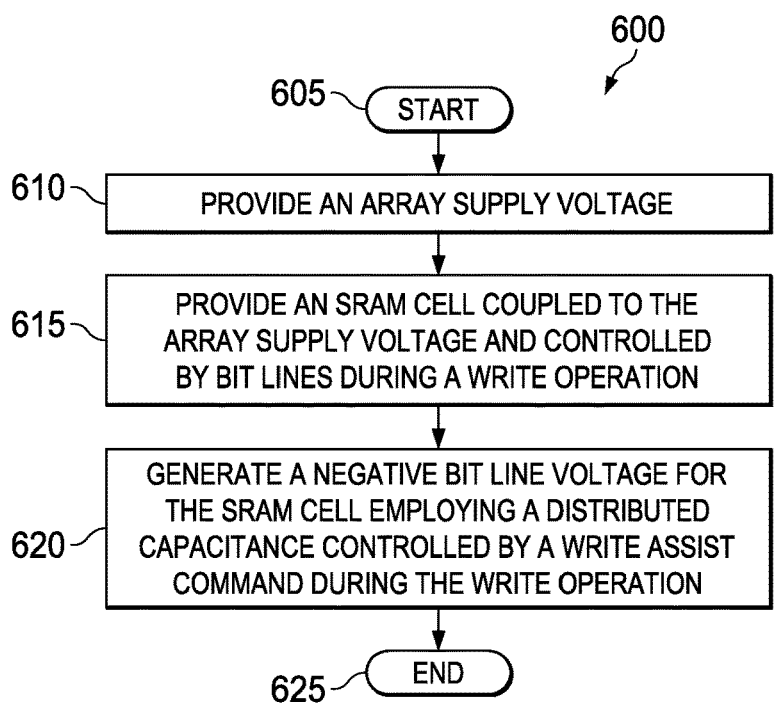
FIG. 6 illustrates a flow diagram of an embodiment of a negative bit line write assist method carried out according to the principles of the present disclosure.

FIG. 6 illustrates a flow diagram of an embodiment of a negative bit line write assist method, generally designated 600, carried out according to the principles of the present disclosure. The method 600 starts in a step 605, and in a step 610, an array supply voltage is provided. Then, a static random access memory (SRAM) cell that is coupled to the array supply voltage and controlled by bit lines during a write operation is provided, in a step 615. A negative bit line voltage for the SRAM cell is generated employing a distributed capacitance controlled by a write assist command during the write operation, in a step 620.

In one embodiment, the distributed capacitance includes an upper metal coupling capacitance, which has interleaved voltage coupling connections and bit line coupling connections. In one case, the interleaved voltage coupling connections and bit line coupling connections include metal fingers having minimum allowable width or spacing. In another case, the interleaved voltage coupling connections and bit line coupling connections include metal fingers of about the same length.

In yet another embodiment, the distributed capacitance includes a fringing capacitance. In still another embodiment, the write assist command provides for charging the distributed capacitance to an initial voltage based on the array supply voltage. In a further embodiment, the write assist command is initiated within a write enable command time period. In a further embodiment, the write assist command is initiated when one of the bit lines reaches a predetermined discharge potential. Here, the predetermined discharge potential corresponds to a common or ground potential. The method 600 ends in a step 625.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

In summary, embodiments of the present disclosure provide advantages that include:

1) Memory layout penalty is greatly reduced since an upper metal layer is employed to form the required coupling capacitance.

2) Metal capacitance variation is smaller than gate capacitance across various PVT corners.

3) Upper layer metal coupling capacitance tracks bit line length. Therefore, a negative bit line voltage ratio to VDD is nearly constant, making the approach suitable for compiler random access memory write assist implementation.

4) A local gate capacitor may be employed to compensate for parasitic and device capacitance of a local bit line discharge path. Capacitor size scales linearly with input-output structure size thereby making the approach suitable for compiler random access memory applications.

Those skilled in the art to which this application relates will appreciate that other and further additions, deletions, substitutions and modifications may be made to the described embodiments.

What is claimed is:

1. A negative bit line write assist system, comprising:
an array voltage supply;
a static random access memory (SRAM) cell that is coupled to the array voltage supply and controlled by bit lines during a write operation; and
a bit line voltage unit that is coupled to the SRAM cell, wherein:
a distributed capacitance is controlled by a single write assist command to provide generation of a negative bit line voltage during the write operation,
said bit line voltage unit including a write assist grounding switch and write assist buffer circuit,
said single write assist command applied to said write assist buffer circuit to provide a charging voltage to said distributed capacitance,
said single write assist command also applied to said write assist grounding switch, and
said distributed capacitance is a fringing capacitance in an upper metal layer of an array of said SRAM cells.

2. The system as recited in claim 1 wherein the fringing capacitance includes interleaved voltage coupling connections and bit line coupling connections.

3. The system as recited in claim 2 wherein the interleaved voltage coupling connections and bit line coupling connections include metal fingers having minimum allowable width or spacing.

4. The system as recited in claim 2 wherein the interleaved voltage coupling connections and bit line coupling connections include metal fingers of about the same length.

5. The system as recited in claim 1 wherein the write assist command provides for charging the distributed capacitance to an initial voltage based on a voltage value of the array voltage supply.

6. The system as recited in claim 1 wherein the write assist command is initiated within a write enable command time period.

7. The system as recited in claim 1 wherein the write assist command is initiated when one of the bit lines reaches a predetermined discharge potential.

8. The system as recited in claim 7 wherein the predetermined discharge potential corresponds to a common or ground potential.

9. A negative bit line write assist method, comprising:
providing an array supply voltage;
providing a static random access memory (SRAM) cell coupled to the array supply voltage and controlled by bit lines during a write operation; and
generating a negative bit line voltage for the SRAM cell employing a distributed capacitance controlled by a single write assist command during the write operation, wherein:
said single write assist command applied to both a write assist grounding switch and a write assist buffer circuit,
said write assist buffer circuit providing a charging voltage to said distributed capacitance when said single write assist command is applied, and
said distributed capacitance is a fringing capacitance in an upper metal layer of an array of said SRAM cells.

10. The method as recited in claim 9 wherein the fringing capacitance includes interleaved voltage coupling connections and bit line coupling connections.

11. The method as recited in claim 10 wherein the interleaved voltage coupling connections and bit line coupling connections include metal fingers having minimum allowable width or spacing.

12. The method as recited in claim 10 wherein the interleaved voltage coupling connections and bit line coupling connections include metal fingers of about the same length.

13. The method as recited in claim 9 wherein the write assist command provides for charging the distributed capacitance to an initial voltage based on the array supply voltage.

14. The method as recited in claim 9 wherein the write assist command is initiated within a write enable command time period.

15. The method as recited in claim 9 wherein the write assist command is initiated when one of the bit lines reaches a predetermined discharge potential.

16. The method as recited in claim 15 wherein the predetermined discharge potential corresponds to a common or ground potential.

\* \* \* \* \*